United States Patent
Bollinger et al.

(10) Patent No.: US 6,467,297 B1
(45) Date of Patent: Oct. 22, 2002

(54) WAFER HOLDER FOR ROTATING AND TRANSLATING WAFERS

(75) Inventors: Lynn David Bollinger, Ridgefield, CT (US); Iskander Tokmouline, New Fairfield, CT (US)

(73) Assignee: Jetek, Inc., Ridgefield, CT (US)

( * ) Notice: Subject to any disclaimer, the term of this patent is extended or adjusted under 35 U.S.C. 154(b) by 21 days.

(21) Appl. No.: 09/689,307

(22) Filed: Oct. 12, 2000

(51) Int. Cl.[7] .................................. F25D 17/04
(52) U.S. Cl. ................. 62/404; 156/345.1; 269/20
(58) Field of Search .................. 269/20; 156/345.1; 62/404

(56) References Cited

U.S. PATENT DOCUMENTS

| | | | |
|---|---|---|---|
| 6,040,548 A | 3/2000 | Siniaguine | 219/121.48 |
| 6,095,582 A | 8/2000 | Siniaguine et al. | 294/64.3 |
| 6,203,661 B1 * | 3/2001 | Siniaguine et al. | 156/345.1 |

FOREIGN PATENT DOCUMENTS

| | | |
|---|---|---|
| RU | 537924 | 2/1977 |
| WO | PCT/EP92/01131 | 5/1992 |
| WO | WO9621943 | 7/1996 |
| WO | PCT/US97/08626 | 5/1997 |
| WO | PCT/US97/09069 | 5/1997 |
| WO | WO9926796 | 6/1999 |
| WO | WO9946805 | 9/1999 |

* cited by examiner

*Primary Examiner*—Ronald Capossela
(74) *Attorney, Agent, or Firm*—St. Onge Steward Johnston & Reens LLC

(57) ABSTRACT

In the method and apparatus of this invention a wafer for manufacturing semiconductor devices is held by a vortex-type substrate holder against a moveable frame during processing. Motion of the wafer is controlled with movement of the frame. The frame is shaped to provide a sealed chamber through which gas that is used to create the vortices is also re-captured. With such sealed chamber a higher heat conducting but more expensive gas can be recycled and used for the vortex holder and cooling of the wafer. In another technique of this invention, damage of the wafer edges from impacts with position limiters is avoided by inserting a small physical off-set of the center of mass of the wafer relative to that of the frame used to rotate the wafer. This prevents sliding of the wafer within the holder. In another feature of the invention end effects during treatment of the wafer are avoided by providing an extension around the wafer. The extension assures that the treating gas stream provides the same treatment to the edge of the wafer as in its center.

11 Claims, 7 Drawing Sheets

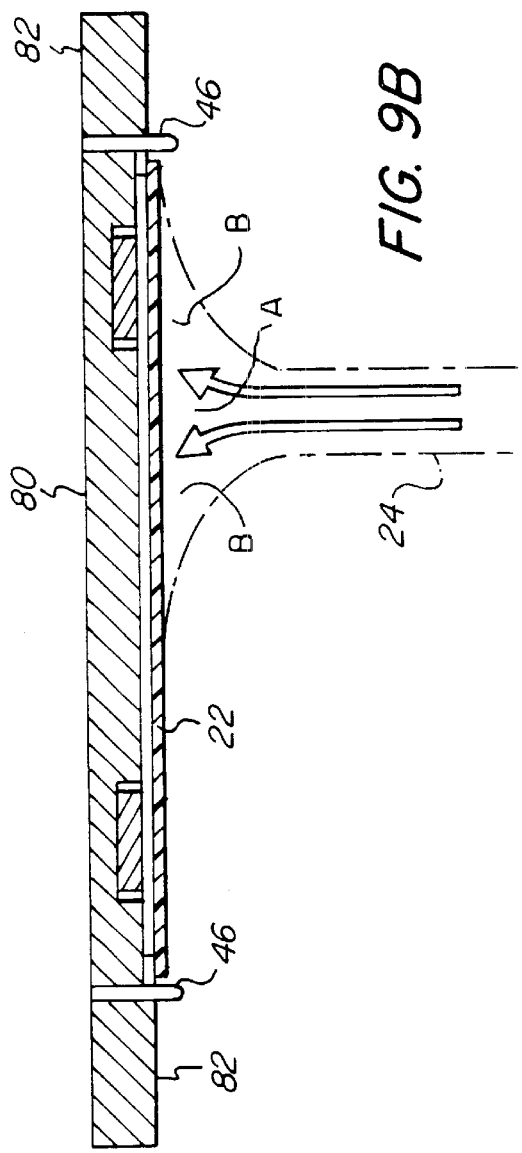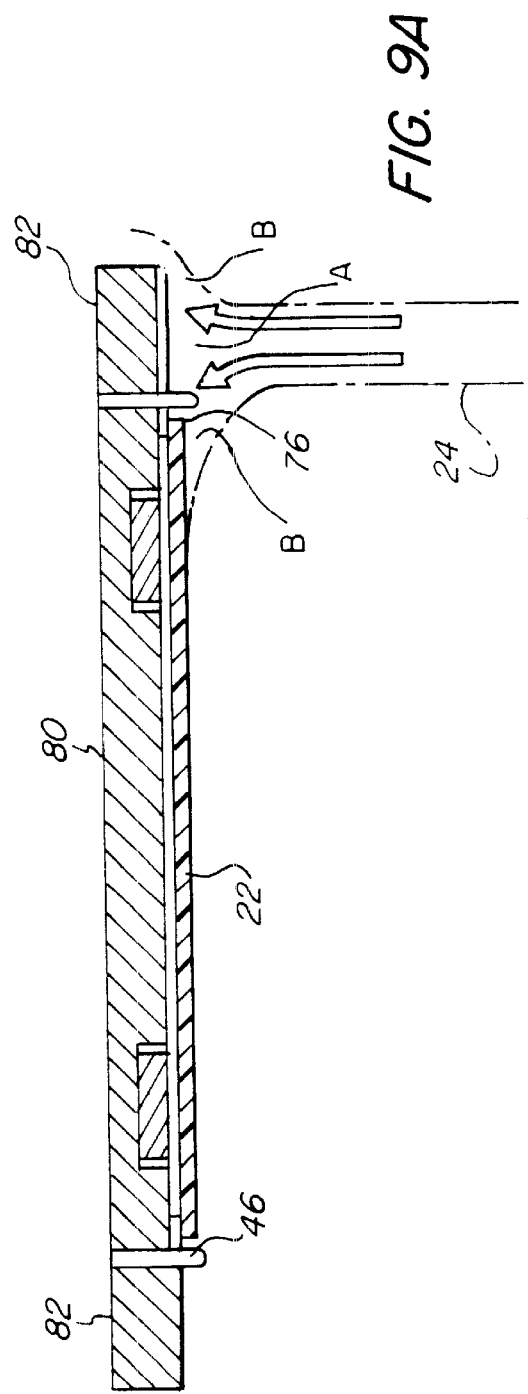

WAFER HOLDER FOR ROTATING AND TRANSLATING WAFERS

FIELD OF THE INVENTION

This invention generally relates to an apparatus for holding wafers during process steps used in the manufacture of semiconductor devices and more specifically to such apparatus for use in such manufacturing processes wherein a hot gas stream is used for treating the wafers.

BACKGROUND OF THE INVENTION

This invention describes improvements to a non-contact substrate holding device using a gas vortex principle for processing substrates and particularly for manufacture of micro-pattern devices. The terms substrate and wafer are used herein interchangeably to depict the object being handled in processes leading to a semiconductor device.

Production of devices employing micron and sub-micron sized micro-patterns require fabrication of the devices on much larger substrates before dicing the substrates or wafers into the individual devices or "chips." Process steps to form micro-patterns in large substrates are the bases for manufacturing micro-electronic devices, such as logic and memory chips, and Miniature, Electronic-Mechanical Machined Devices (MIMMS), such as miniaturized gas, pressure and strain sensors.

A preferred substrate or wafer processing technique for which the invention can be used involves the treatment of a wafer by an intense hot gas stream. Hot gas process applications include etching material from the substrate and thermal processing of the substrate. One such an application is described in a U.S. Provisional patent application Serial No. 60/156,407, filed Sep. 28, 1999 and entitled "Atmospheric Process and System For Controlled Rapid Removal of Polymers From High Depth to Width Aspect Ratio Holes".

The principle of holding a wafer in a non-contacting manner with a vortex holding scheme is described in detail in the international patent WO9745862, entitled "Non-contact holder for wafer-like articles," inventors Siniaguine and Steinberg, filed 1997. A schematic presentation of a prior art non-contact vortex type substrate holder as described by WO9745862 is shown in FIG. 1 in this application.

Use of a holder using a gas vortex principle for the non-contact transport of heavy articles has been described in patent SU537924 (Soviet Union), entitled "Vacuum lifting device," assignee Khark Aviation Institute, filed 1977. Atmospheric plasma systems for processing substrates that use a non-contact substrate holder based on a gas vortex principle have been described in the international patents WO9621943, entitled "Device for treating planar elements with a plasma jet," Mikhailovich et al, filed 1995; and WO9221220, entitled "Apparatus for the treatment of a solid body," Vecleslav et al, filed 1992. Specific hardware designs for a vortex chuck substrate holders are described in international patents WO9946805, entitled "Holders suitable to hold articles during processing and article processing method," Kaufman and Siniaguine, filed 1999; and WO6095582 entitled "Article holders and holding methods," John and Siniaguine, filed 1999.

When a hot gas stream, that is smaller in cross-section than that of the substrate, is used to treat the substrate, the substrate holder must move the substrate through the hot gas treatment area with a controlled motion pattern so as to uniformly treat the substrate. Use of a non-contact vortex type substrate holder for processing substrates with a hot gas stream generated by an atmospheric arc type plasma, often referred to as a plasma jet, is described in WO9745862, WO9621943, WO9221220 and WO9946805, referenced above. The motion configurations described in these patents relate to processing batches of substrates using multiple holders. Heat is transferred from the substrate to the holder and presumably from the holder to the ambient gas inside the process chamber.

An atmospheric plasma generating system, often referred to as a plasma jet that can be used to generate a suitable hot gas stream, has previously been described, see U.S. Pat. No. 6,040,548, by Siniaguine, entitled "Apparatus for generating and deflecting a plasma jet," filed 1997.

In the above prior art, wherein use of vortex type substrate holders is described, wafers are processed in batches and heat is transferred to the substrate holder from the substrate by air cooling that is enhanced by the holders' motion. Conventional vortex type non-contact substrate holders nevertheless, have the following disadvantages:

1. Heat transfer from the substrate to the holder is a function of gas flow along the substrate surface inside a gap between the substrate holder and the substrate. The gas flow is produced by a rotating gas, which emerges from the vortex chucks. This gas flow is not uniform over the surface of the substrate facing the wafer holder and as a result uneven temperatures across the wafer during processing tend to arise.
2. With accelerating motions of the substrate holder the substrate can impact the "limiters" that constrain the wafer to the holder. For mechanically delicate substrates, this impact can chip the substrate edges.
3. Edge effects tend to arise in processes using a hot gas stream. When the substrate is moved out of the gas stream, the gas flow characteristics are different near the edge of the substrate compared to when the gas stream is near the substrate center. This can cause non-uniformity in the processing that may be difficult to compensate for by varying process parameters.
4. The ability to handle high heat flux is limited. Hence when processing applications require a high heat flux onto the substrate surface, very rapid heat removal from the substrate to the holder and from the holder may be required to avoid an uncontrolled upward drift in the wafer temperature during processing.

Compared to substrate holders that mechanically clamp the substrate against a cooled surface for heat removal, such as by electrostatic clamping or vacuum clamping, a non-contact wafer holder is particularly useful for applications that involve processing with an intense hot gas stream whose treatment area is smaller than the substrate size. Differential heating of the wafer due to the localized area of the treatment area can cause temporary thermal distortion of the wafer. A non-contact holder can allow the wafer to move without putting mechanical stress in the wafer from mechanical constraint and at the same time not strongly affecting the local heat removal capability.

SUMMARY OF THE INVENTION

In one method and apparatus in accordance with the invention, the wafer, which is being processed, is held by a vortex-type substrate holder against a moveable frame. Motion of the wafer is controlled with movement of the frame. The frame can be shaped to provide a sealed chamber through which gas used to create the vortices is re-captured. With such sealed chamber a higher heat conducting but more expensive gas can be re-cycled and used for the vortex holder and cooling of the wafer.

In another technique of this invention, damage of the wafer edges from impacts with position limiters is avoided by inserting a small physical off-set of the center of mass of the wafer relative to that of the frame used to rotate the wafer. This prevents sliding of the wafer within the holder.

In another feature of the invention end effects during treatment of the wafer are avoided by providing an extension around the wafer. The extension assures that the treating gas stream provides the same treatment to the edge of the wafer as in its center.

It is, therefore, an object of the invention to provide improved more uniform treatment of substrates, better temperature control of the substrates, and less possibility of damage to substrate edges.

It is a further object of this invention to provide methods to improve the performance of a vortex chuck retention mechanism during the processing of a wafer with an intense hot gas stream that is smaller in size than the wafer.

It is a further object of the invention to provide a method and apparatus with which temperature imbalance effects on the wafer from the vortices used to hold the wafer are reduced, with which the need for a rotating gas seal is advantageously eliminated to avoid the generation of incompatible particles and with which a chipping of the substrate edges from impact of the substrate against holder limiters during accelerations of the substrate holder is avoided.

It is still further an object of the invention to provide a wafer holder that enables similar gas flow conditions for the hot gas stream treatment area near the outer edge compared to the central area of the substrate. This allows for more uniform treatment of the substrate. The programmed motion of the substrate through the hot gas stream treatment area then more easily compensates for treatment effects near the edge of the substrate.

With a substrate holder in accordance with the invention the treatment of a substrate by a hot gas stream can be done with tight control of the substrate temperature and with an increase in the heat transfer from the substrate. A direct fluid cooling of the substrate holder can be done with process temperature feedback to the cooling fluid temperature. Helium can be used as the gas injected into the vortex chucks of the substrate holder to yield significantly higher heat conductivity while enabling a re-circulation of the helium to reduce expenses. Variations in the local heat removal from the substrate can be obtained by injecting gas into the vortex chucks that has the same temperature as the substrate holder. A greater heat removal from the substrate is made possible with tight control of temperature by using a liquid, such as water, and use its heat of vaporization for cooling of the substrate.

With a motion configuration in accordance with the invention a rotary motion is combined with translation for the substrate through a treatment area in an advantageous manner for full treatment of a substrate by a smaller treatment area. Since gas flow for the vortex substrate holder to a conventional rotating substrate holder must go through a rotating gas seal, the rotating seal tends to generate some microscopic particles that can cause a yield problem in the manufacture of devices especially when these have feature sizes in the micron and sub-micron range. With one substrate holder in accordance with the invention the vortex holder is separated from the rotating mechanism so that a rotating gas seal is not necessary and, therefore, small particles from the seal are not produced.

These and other advantages and objects of the invention can be understood from the following detailed description of the drawings in which:

BRIEF DESCRIPTION OF THE DRAWINGS

FIGS. 9A and 9B are side section views of still another substrate holder in accordance with the invention and showing different positions of the holder relative to a treating gas flow.

DETAILED DESCRIPTION OF THE DRAWINGS AND INVENTION

Figure 1:
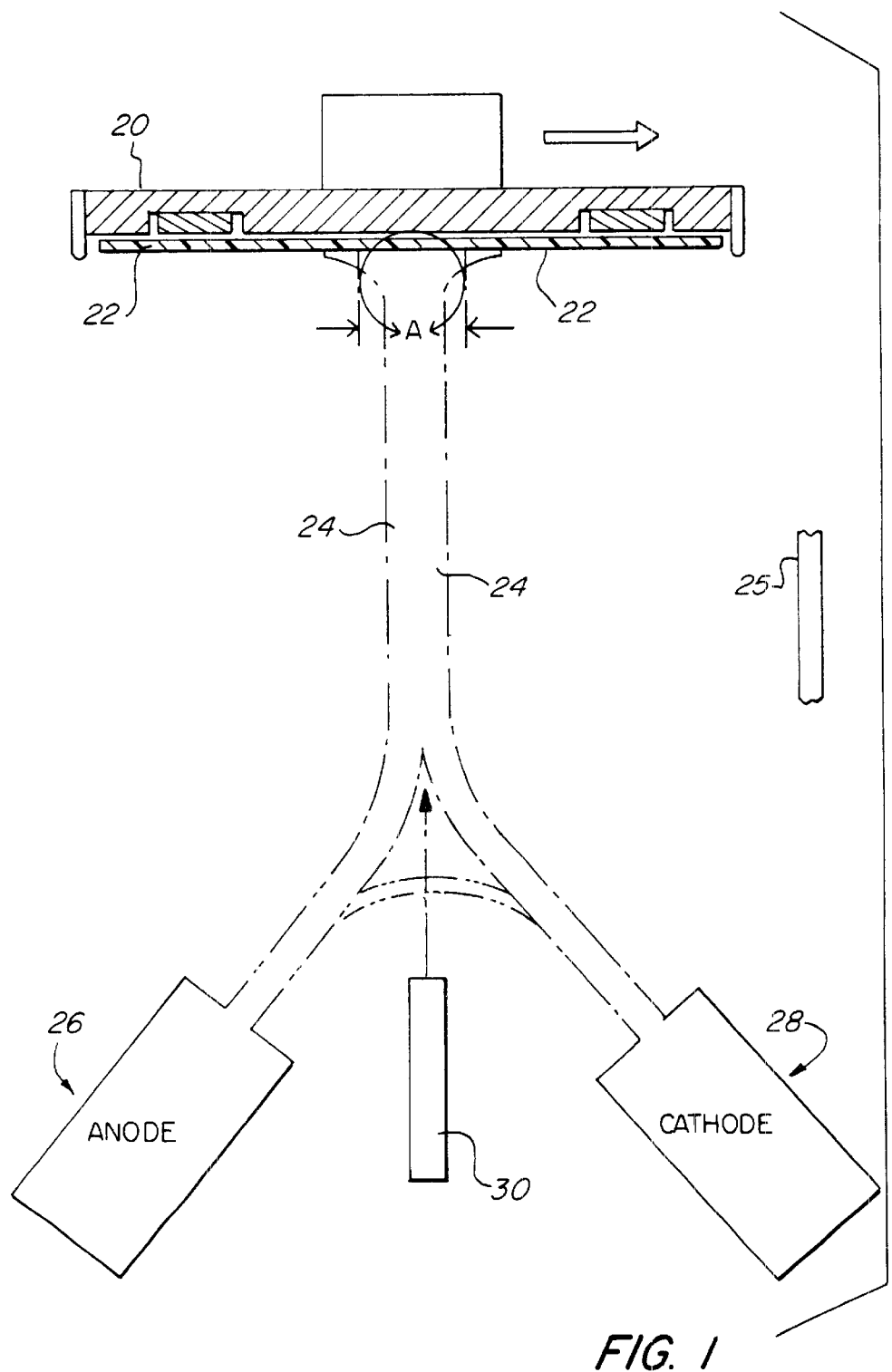
FIG. 1 is a schematic representation of one plasma processing system with which a substrate holder in accordance with the invention can be used.

With reference to FIGS. 1 through 4 a conventional substrate holder 20 is shown placed to retain a wafer or substrate 22. The holder 20 is of the vortex type as described in detail in WO9745862. FIG. 1 shows the vortex type holder 20 in position to be treated by an atmospheric hot gas stream 24 generated inside a chamber 25 with an arc, sometimes referred to as a plasma jet, produced between an anode 26 and cathode 28. A gas injector 30 is shown to inject additional gas into the hot gas stream 24 that is directed at the wafer 22. The hot gas stream treatment area A has dimensions that are substantially less than the surface area of the substrate 22. The plasma processing of FIG. 1 is described in a co-pending international patent application filed with the United State Receiving Office on Sep. 28, 2000, designating the United States, and entitled Atmospheric Process and System For Controlled Rapid Removal of Polymers From High Depth To Width Aspect Ratio Holes" based on a Provisional patent application Filed on Sep. 28, 1999 with Ser. No. 60/156,407. An atmospheric plasma generating system, often referred to as a plasma jet, has also previously been described, see U.S. Pat. No. 6,040,548, by Siniaguine, entitled "Apparatus for generating and deflecting a plasma jet,".

The gas injector 30 may be used to inject a gas such as oxygen or a mixture of gasses directly into the hot gas stream. Without a flow of gas from the gas injector 30, the hot gas stream is composed primarily of the inert gas from the two electrode assemblies and from the process chamber 25 ambient gas that is entrained into the hot gas stream. The temperature of the gas stream at the hydrodynamic gas boundary over the wafer surface 28 may typically be approximately 8,000° C. could be in the range of 4,000 to 12,000° C. This temperature may be controlled by controlling the distance d of the electrode assemblies 26, 28 from the substrate 22 and the power into the arc type plasma. Typical power parameters for driving the arc plasma are approximately 150 V and 80 A.

The size of the treatment area generally denoted as A, where the stream 14 is incident upon the substrate surface, is approximately 2 cm diameter, normally less than the size of the substrate 22 to be processed (e.g., a 200 mm diameter silicon wafer). Consequently, the entire substrate surface is treated by multiple passes of the wafer 10 through the treatment area using a motion configuration that provides for treatment over the full wafer area. The relative motion of the wafer 22 with respect to the treatment area is programmed so that uniform treatment can be obtained. Motion configurations can be by way of step and scan or by way of rotation with translation of wafer 22.

Figure 5:
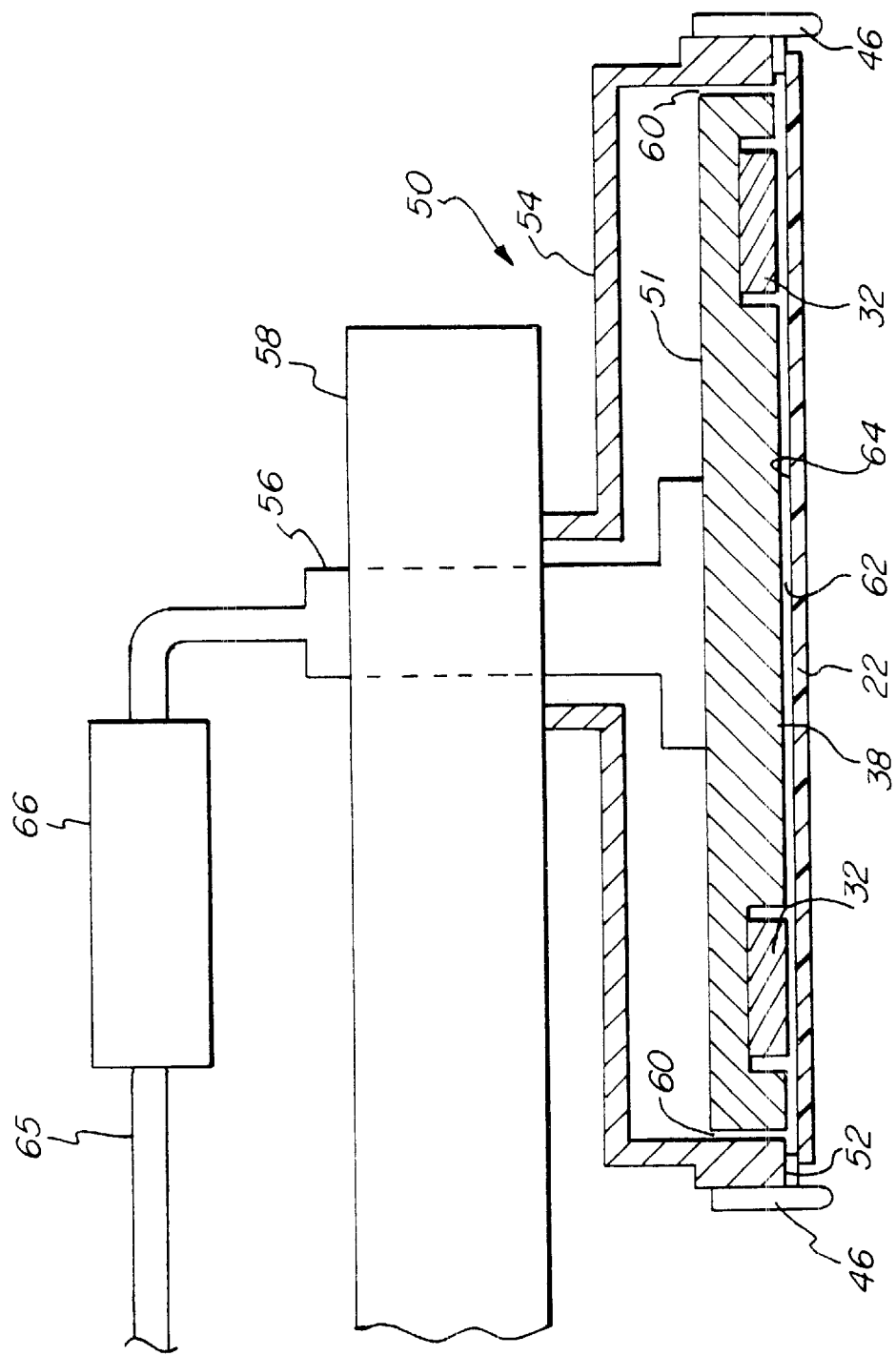
FIG. 5 is a partial section and side view of a non-contact vortex type substrate holder in accordance with the invention.

The substrate holder of this invention, as initially shown in FIG. 5, can be used with other processes than that as shown in FIG. 1, which is illustrated here to provide a background for the invention.

Figure 2:
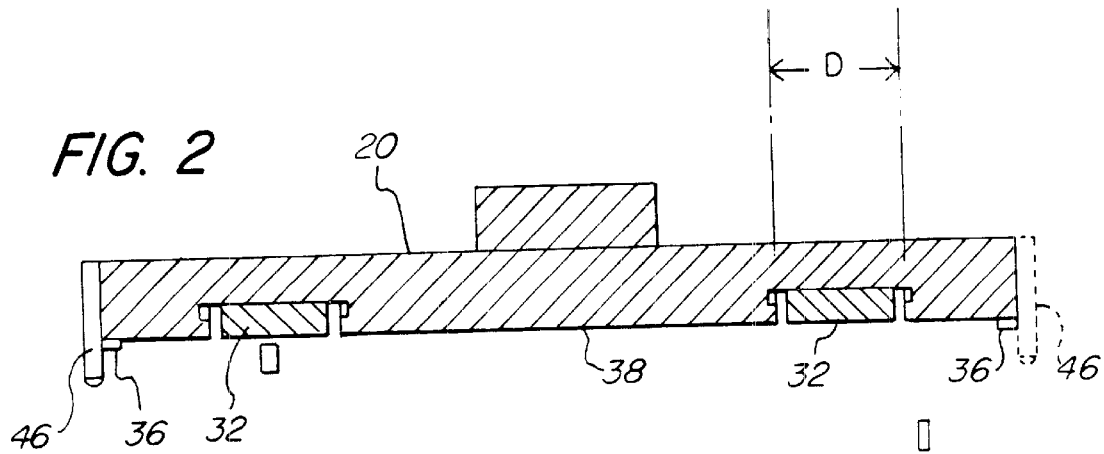
FIG. 2 is a side section view of a conventional substrate holder.
Figure 3:
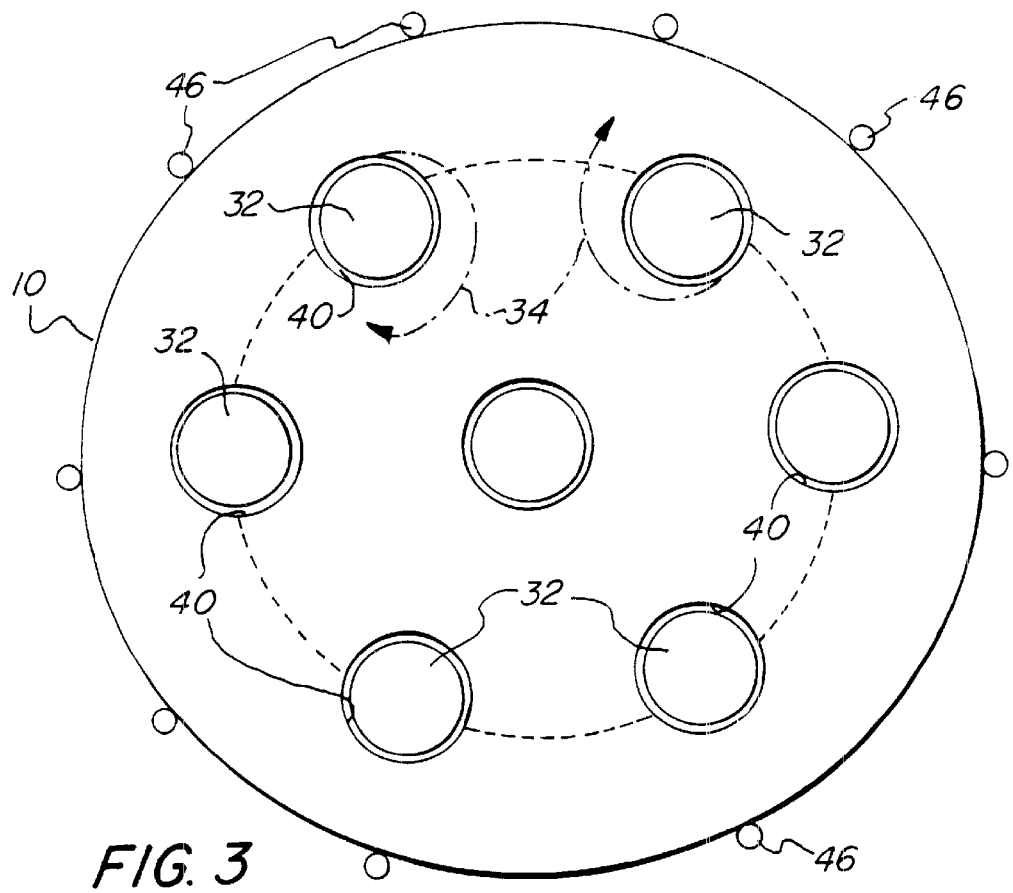
FIG. 3 is a bottom plan view of the substrate holder of FIG. 1.
Figure 4:
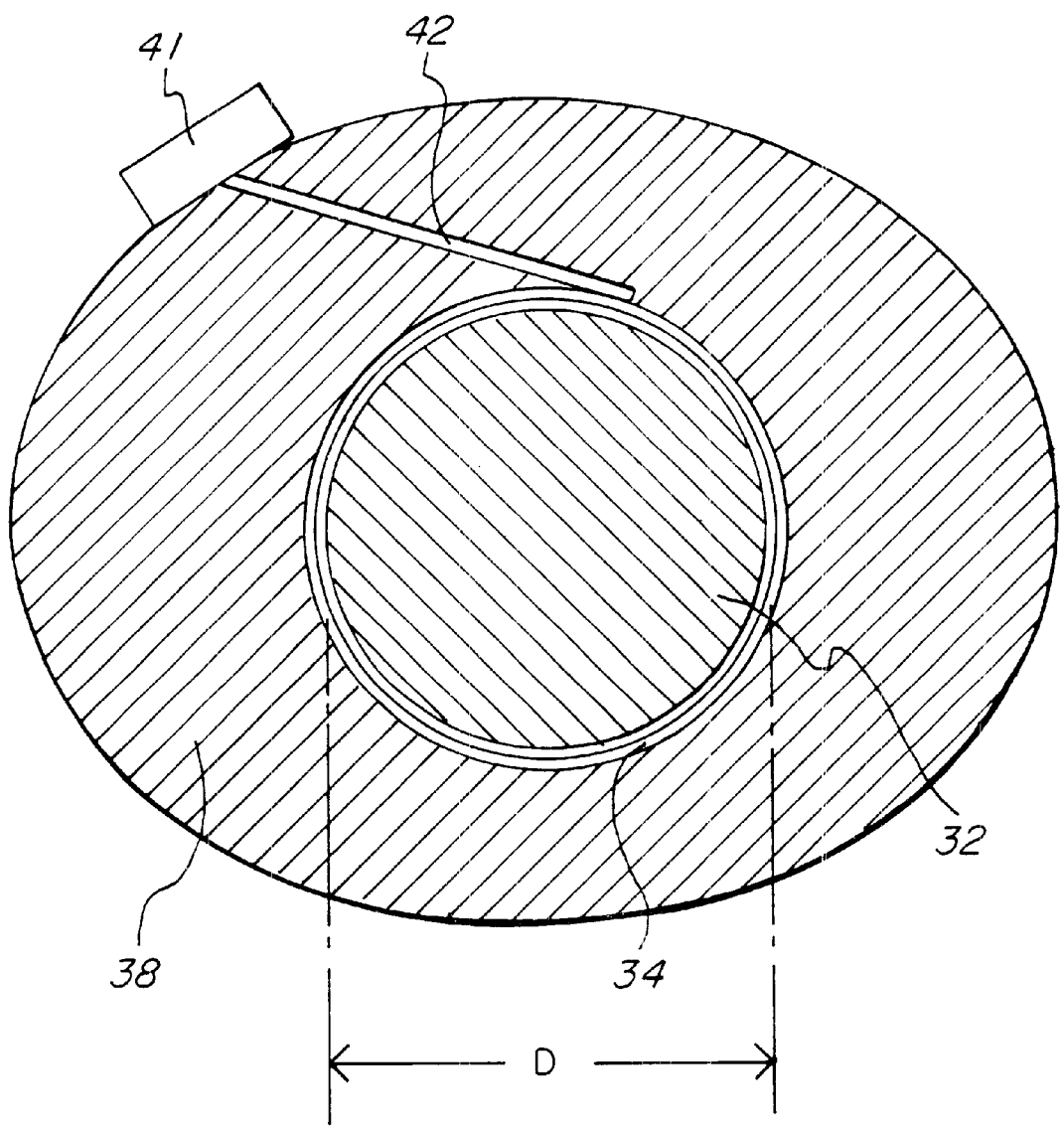
FIG. 4 is an enlarged top cross-section bottom view of a vortex chuck used in the substrate holder of FIG. 2.

With particular reference to FIGS. 2, 3 and 4 a conventional substrate holder 10 is shown having vortex chucks 32. These produce a circular flow of gas, as illustrated by broken arrows 34 to create a negative or lifting force that can keep a wafer 12 against stops 36 spaced around the periphery of the surface 38 of the substrate holder 10. FIG. 2 shows six vortex chucks 32 each consisting of an annular channel 40. As shown in FIG. 4, a stream of gas, such as nitrogen, is introduced from a supply 41 tangentially through a hole 42 into the upper section of each annular gas channel 34, having an outside diameter D, by feeding the gas through small diameter, long hole 42. D may be in the range of 0.5 mm to 5 mm.

The vortex chuck 32 may consist of an open hole rather than an annular ring as shown in FIGS. 2–4, with the gas also introduced tangentially at the top of the open hole. The gas flow into each vortex chuck may be in the range of 1 to 10 sccm. As a result of the gas flow introduced into each vortex chuck, the vortex chucks create an outward spiraling stream of gas 40 in the gap between the holder and the substrate that starts at diameter D, shown for two vortex locations in FIG. 3. This outward spiraling gas flow generates a low-pressure area inside the diameter D at each vortex chuck 32. A number of vortex chucks may be contained on an individual holder 20. FIG. 3 shows six vortex chucks 32. The orientation of the outward spiraling gas may be counter directional as shown in FIG. 3 or in the same directions. A substrate held by the low pressures from the vortex chucks 32 is prevented from sliding away from the holder surface 38 by a set of limiters 46.

With reference to FIG. 5, a circular substrate 22, such as a semiconductor silicon wafer, is mounted on a wafer holder 50 in accordance with the invention. The wafer 22 is held in an upside down position by low-pressure areas generated by vortex chucks 32 in a wafer holder body 51 containing the chucks 32. In the embodiment of FIG. 5 the wafer 22 is held against a lower edge or multiple lips 52 of a rotationally mounted frame 54 that surrounds the wafer holder 50.

The frame 54 is rotationally mounted with respect to the substrate holder body 51 by way of suitable bearings, not shown, on a stationary hollow shaft 56 feeding gas to the stationary vortex chucks 32. An actuator 58 is used to rotate the frame 54 and provide translation motion. The actuator can take many forms and preferably provides a smooth and precisely controllable motion relative to a hot gas stream 24 and its treatment area A, see FIG. 1. In the embodiment of FIG. 5 the frame 54 is shaped to provide a small peripheral channel 60 through which gas from the vortex chucks 32 can escape from the space 62 between the chucks 32 and the backside 64 of wafer 22.

The actuator 58 provides two independently controlled motions, namely, translation to the entire substrate holder assembly 50; and a rotational drive for the rotating frame 54. A means for the translation, but not limited thereto, would be by a linear stage type actuator. Means for delivering the rotational drive to the frame 63 are by gear or flexible belt (e.g., steel belt, chain) drives. Gas to the vortex chucks 32 is delivered by a gas line 65 that attaches to the non-rotating body shaft 56. A gas particle filter 66 removes any particles that may be entrained in the feed gas. The feed gas line 65 has a flexible joint or flexible section, not shown, such as a simple, commercially available stainless steel flexible hose, to allow for the translation motion of the substrate holder 50. It is preferable that the flexible section or joint be upstream of the particle filter 66 so that the filter prevents access of any particles to the flexing section. Since there is not a rotating gas seal in the substrate holder assembly 50 to generate particles downstream of the particle filter, particles can be eliminated from the gas flowing from the vortex chucks 32.

FIG. 5 shows the design concept by which a non-contact vortex type holder 50 for circular substrates 22 such as silicon wafers may be used to rotate the substrate 22 without rotating the body of the holder 51 that includes the vortex chucks 32. The holding frame 54 is circular, though other shapes can be used, and is circumferential to and surrounds the holder body 51. Its lip 52 is slightly lower than the surface of the body of the substrate holder, typical range being between about 0.1 and about 3 mm. The lip 52 may be a continuous ring or a series of discrete, raised sections from the ring. The vortex chucks 32 pull the wafer against the lip. The lip 52 only makes contact with the substrate on the outer substrate diameter that is not used as an active area (e.g., contact <3 mm from the edge of the substrate 22). Frictional contact between the lip 52 and the substrate 22 then permits the substrate 22 to rotate with the frame 54 relative to the stationary body 51. Limiters 46 prevent the substrate 22 from sliding out of the holder area.

The substrate holder 50 shown in FIG. 5 advantageously provides:

1. Uniform processing for temperature dependent wafer treating processes. Temperature of a substrate during processing is a function of the gas flow on the backside 64 of that area of the substrate. In the regions of the vortex chucks there is a locally higher area of gas flow that increases the cooling of that area of the substrate. By moving the substrate relative to and over the vortex chucks, the cooling effect is averaged over a given radius for a rotary motion. The motion through the hot gas treatment area (i.e., the center of rotation of the substrate) can be programmed to correct process variations that are symmetric about the axis of rotation.

2. Since there is no rotating gas seal to introduce particles into the gas flow to the substrate holder downstream of the gas filter, see FIG. 6, gas flow from the holder vortex chucks can be particle free.

3. Direct fluid cooling of the substrate holder body 51 without a rotating fluid seal.

As shown in FIGS. 3 and 5, the limiters 46 define the area in which the substrate is contained. To account for different size substrates 22 and to assure that the substrate does not get jammed between the limiters 46, the dimensions of the contact area of the limiters must be slightly larger than the dimensions of the substrate (e.g., 0.5 mm). A problem with a motion configuration of a rotating substrate 22 and a programmed translation of its center of rotation through the hot gas treatment area to give uniform treatment is that high acceleration of the programmed translation motion may be needed as the substrate center passes through the hot gas treatment area. For uniform treatment, a simple geometric approximation for the relative velocity of the substrate with respect to the treatment area gives the wafer velocity as proportional to $(r)^{-1}$ where r is the distance of the plasma treatment area from the center of rotation. The velocity, and consequently the acceleration, does not become infinite at the center of rotation because of the finite size of the treatment area. A high acceleration can cause the substrate 22 to shift in the holder 50. For fragile substrates, such as very thin wafers, chipping of an edge could result.

Figure 8:
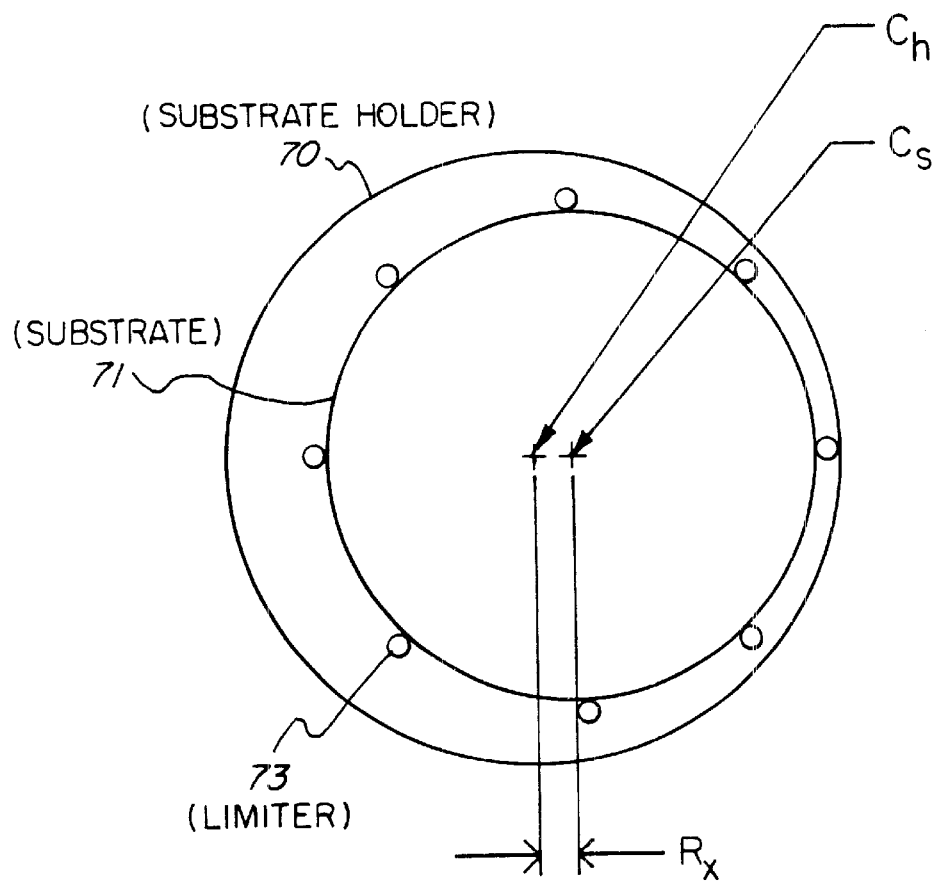
FIG. 8 is a schematic view of the bottom of another substrate holder in accordance with the invention showing the geometric configuration of a substrate being held in a substrate holder with the center of mass of the substrate offset from the axis of rotation of the substrate holder.

A method to prevent such damage is a configuration as illustrated in FIG. 8 in which the axis of rotation is offset from the center of mass of the substrate 22 in FIG. 2, in the plane of the substrate. The offset distance must be large enough that the resulting centrifugal acceleration of the substrate 22 overcomes the programmed translation acceleration. In reference to FIG. 8, a substrate 71 with a center of mass located at $C_s$ is mounted on a substrate holder 70 whose axis of rotation is at $C_h$. $C_s$ is off-set from $C_h$ by a distance $R_x$. The substrate's position is defined by a set of limiters 73.

The distance off-set distance $R_x$ to overcome the programmed translation acceleration of the substrate holder, $A_p$, is obtained by setting the centrifugal acceleration equal to the programmed translation acceleration. Provided $R_x$ is much less than a characteristic dimension for the area of the hot gas treatment, typically ~2 cm for an atmospheric plasma system, the uniformity of processing will not be affected.

$$A_p = (2\Pi R_x/T)^2 (R_x)^{-1} \quad (1)$$

where T=period of wafer rotation.

$$R_x = A_p (T/2\Pi)^2 \quad (2)$$

A typical maximum acceleration for obtaining uniform processing of a 200 mm wafer is $A_p$=10 m/s²; a typical rotation is 15 rps giving T=0.067 sec. Putting these values into (2) gives $R_x$=0.0011 m=1.1 mm. Consequently, for these motion values, a choice of $R_x$=2 mm would provide a centrifugal acceleration that would overcome the programmed translation acceleration of the wafer through the treatment area and keep the wafer from sliding within the holder area defined by the limiters. And, since $R_x$=2 mm is much less than the diameter of the plasma treatment area, ~2 cm diameter, there will be no effect on the treatment uniformity.

FIG. 8 shows a circular substrate. The same principle can be applied to non-circular substrates, such as square glass mask plates for photolithography, provided the center of mass of the non-circular substrate is used for the off-set distance $R_x$. For a non-circular substrate, the location of the substrate on the holder is defined by the location of the limiters that would be set in a pattern appropriate for the substrate shape.

The principle to prevent substrate motion by off-setting the center of mass of the substrate 22 from the axis of rotation can be applied to the substrate holder 50 for circular substrates 22 shown in FIG. 5 in which the substrate 22 is rotated over a non-rotating substrate holder body 51.

For the substrate holder geometry of prior art as shown in FIGS. 1 and 2, the substrate holder diameter is only slightly larger than the substrate diameter (e,g., ~1 mm). In practice, the hot gas treatment area is not sharply defined. Rather, the area A is smoothly spread out by the hydrodynamic gas flow over the wafer surface, see FIG. 9B. Consequently, as the hot gas treatment area moves off the substrate, in the prior art design of FIGS. 1 and 2 there is no adequate processing of the wafer from the outward flow from the hot gas treatment area. As a result, there is relatively less treatment of the area close to the substrate edge relative to the area close to the substrate center.

This unequal effect may be compensated for with a programmed motion of the substrate 22 through the hot gas treatment area by slowing down the motion near the substrate edge. Difficulties with this motion profile compensation is that there is a relatively longer exposure to the intense portion of the hot gas treatment area near substrate edge area resulting in a proportionately greater amount of heat input to the edge area. Also, the lower velocity at the edge requires a greater dynamic velocity range for the motion control system, that is, a much higher ratio of the relative velocity over the center to the velocity over the substrate edge.

A method and apparatus to prevent this gas flow edge effect from adversely affecting the processing of the wafer near the edge is to extend the substrate holder 20 of FIG. 2 beyond the edge of the substrate 22. With reference to FIGS. 9A and 9B, when the primary treatment area A of the hot gas stream 24 is over a central portion of the substrate, the flow of gas out from an area A gives a smaller, secondary treatment in an adjacent area B that is symmetric with respect to A.

However, for a prior art substrate holder as shown in FIG. 2, the treatment area A is just off the edge of the substrate 22 and holder 20 the outflow from the hot gas stream over the edge area of the substrate ceases. Accordingly, as shown in FIGS. 9A and B, the substrate holder 80 is modified with the addition of an extension 82 around the holder's perimeter. The substrate holder extension 82 is added to the perimeter of the substrate holder outside of the position limiters 46. The extension 82 is located to extend the plane of the substrate 22 so that the peripheral area of the substrate 22 will be exposed to the same secondary treatment area B as the main treatment area A moves off the substrate 22.

The flow pattern of the process gas 24 as the treatment area moves off the wafer edge will be similar to the flow pattern over the central area of the wafer. The velocity of the substrate as it moves out of the treatment area can thus be maintained at a higher relative velocity with uniform treatment. The substrate holder extension 82 should be at least half the width of the main treatment area A and preferably greater than the width of A. A typical dimension for A is 2 cm. A may be in the range of 0.5 cm to 5 cm. A may have a circular shape but it can also be elliptically shaped by choice of the plasma generation parameters and the gas that is injected into the hot gas stream, such as by the gas injector 30 in FIG. 1.

The substrate holder extension consideration applies to all motion configurations of the substrate through the hot gas stream for which the treatment area A is moved off the wafer edge, whether the motion configuration is rotation and translation, or, a step and scan type motion. It applies as well to the method of rotating the substrate over a non-rotating substrate holder body as shown in FIG. 5 and applies to circular and non-circular substrates.

In prior art as described in the previously referenced patent WO9745862, heat from the substrate holder is removed primarily by heat transfer from the holder to ambient air. Fins are added to the holder to increase this effect. In order for heat transfer to occur, the holder temperature must rise above the ambient gas temperature during processing. For a process in which the substrate is temperature sensitive, or the process rate is temperature dependent, this lack of control over the substrate temperature can have unacceptable consequences.

Direct flow of a coolant through the substrate holder will increase the heat removal capability from the holder and substrate and limit the temperature rise of the substrate during processing.

One technique for controlling the heat removal from a substrate holder according to the invention involves an active cooling of the holder with fluid temperature sensing and feedback to regulate its temperature. The substrate holder may be actively cooled by a re-circulating system that keeps the heat removal fluid at a temperature near and somewhat below what is needed for processing of the substrate.

Means to uniformly increase heat flow from a substrate to the substrate holder are described in following paragraphs. To significantly decrease substrate processing time, a higher heat input to the substrate is usually needed; a high heat input is required for some applications such as those involving thermal processing. Increased heat removal from the substrate is then needed. The temperature of the cooling fluid (e.g. de-ionized water or other liquid or gas refrigerant) may be reduced to enhance heat transfer from the wafer by increasing temperature differences between cooling fluid and the substrate holder, and, between the holder and the substrate. Temperature feedback from the measured substrate temperature to the coolant temperature can then be used to control the substrate temperature to within a prescribed temperature range. One means of measuring the substrate temperature in the process chamber is by means of a commercially available, remote infrared temperature sensor.

If the gas flowing out from the vortex chucks is below the substrate holder temperature, then as the gas flows out of the vortex chuck it will effectively cool the substrate in that area to a different temperature. The gas introduced to the substrate holder may simply brought to the wafer holder temperature by having the gas travel through a gas reservoir or a sufficiently long channel in the substrate holder so that the gas comes to the controlled holder temperature.

Figure 6:
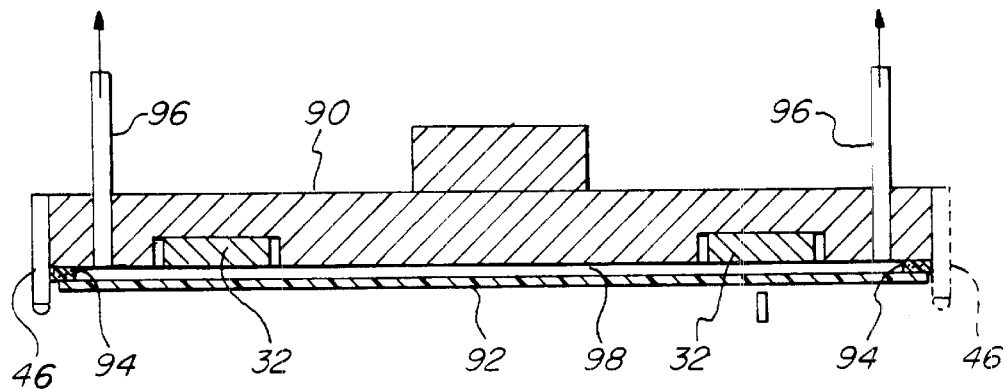
FIG. 6 is side section view of another non-contact vortex type substrate holder in accordance with the invention for re-circulating the gas used in the vortex chucks.

With reference to FIG. 6 a substrate holder 90 is shown with which a higher heat conducting gas, such as helium, can be used for the vortex chucks and used to remove heat from the substrate 92 and then re-cycled. The capability to recycle the gas used for the substrate holder vortex chucks 32 will reduce gas cost and allows use of a more expensive but more effective gas, such as helium, for heat transfer from the substrate 92 to the substrate holder 90 without adding to the cost of the processing. The gas recycling design is more easily implemented for applications where a rotating frame with a stationary wafer holder body as illustrated in FIG. 5 is not needed. One such class of applications would be for a wafer motion configuration of "step and scan" rather than rotate and translate; for such a configuration the wafer holder would not rotate. However, it should be understood that the rotating frame described with reference to FIG. 5 could be used to recapture and re-cycle the vortex gas.

With reference to FIG. 6, the substrate holder 90 holds substrate 92 by means of the partial vacuum generated by vortex chucks 32 which pulls the substrate 92 up against a continuous ring lip 94 that makes a seal between the substrate 92 and the holder 90. The gas flowing from the vortex chucks 32 can then be captured and returned to a recycling unit for re-use by means of a return gas structure 96 that returns the gas from the vortex chucks 32 to the recycling unit. The lip 94 is not expected to make a full hermetic seal, a small leakage of an inert gas, such as 1%, could easily be tolerated in terms of the overall saving obtained by recycling the gas. Since the partial vacuum areas that pull the substrate against the lip 94 are localized at the vortex chuck areas, the gas pressure between the substrate 92 and the holder near the lip 94 can be made to be greater than the ambient gas pressure. Consequently, any small leakage of gas from the vortex chucks tends to be directed outwardly from the space 98 behind the substrate 92. In this manner the return gas is not diluted by ambient gas. For those time intervals when there is not a substrate 92 on the holder 90, such as during substrate loading to the holder, the recycling structure 96 can be closed so as not to dilute the gas used for the vortex chucks.

Figure 7:
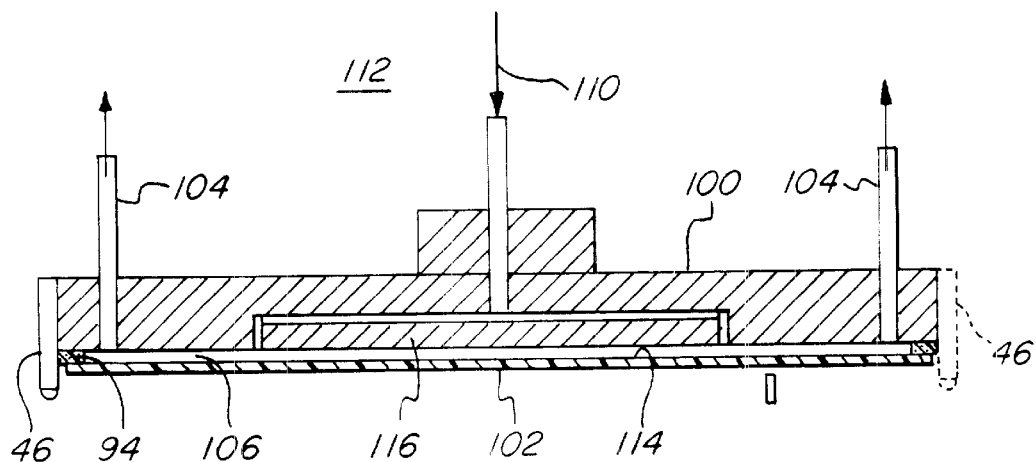
FIG. 7 is side section view of another non-contact vortex type substrate holder in accordance with the invention that uses the heat of vaporization of a liquid to remove a large quantity of heat from the substrate during processing by a hot gas stream.

With reference to FIG. 7 another technique 100 is shown to control the temperature of substrate 102. The substrate temperature may be held stable while removing a large amount of heat by choosing a cooling fluid with specific boiling point temperature, such as for water with a boiling point temperature of 100° C. at atmospheric pressure. For a 1° C. temperature rise of 1 gm water, 1 calorie is absorbed; while for vaporizing 1 gm water at 100° C., 539 calories are absorbed with no temperature rise of the fluid/gas. The pressure dependence of the boiling point of the liquid coolant can be used to adjust the substrate and substrate holder temperatures. Control of the pressure can then used for fine control of substrate holder and substrate temperatures.

With reference to FIG. 10, a slight partial vacuum is drawn through the return gas structure 104 in the gap 106 between the substrate holder 100 and the substrate 102. The substrate 102 is pulled against continuous lip 94 that makes contact and a seal with the peripheral edge of the substrate 102 that faces the holder. A liquid 110 that has a boiling point near the prescribed processing temperature of the wafer and a vapor pressure, at the boiling point temperature, near the ambient pressure of the process chamber 112 surrounding the holder 100, is sprayed onto the back surface 114 of the substrate 102 through a liquid feed structure 116. The vaporized liquid 110 is removed from behind the substrate by the return gas structure 104.

Water, having a boiling point at 100° C. at a pressure of one atmosphere, can then be used to provide a substrate process temperature near 100° C. The pressure differential across the substrate needed to hold the substrate and provide the vacuum seal depends on the substrate mass. For a 200 mm silicon wafer, having a typical thickness of 0.75 mm, a pressure differential of 0.5% to 1% of atmosphere would suffice for holding the substrate against the substrate holder lip 94.

A means for the required pressure differential, not shown, is provided with a feedback signal from a pressure differential sensor on the return line from the return gas structure 104. The feedback signal is sent to a vacuum generation apparatus, such as a small mechanical pump with a variable inlet valve to control the vacuum.

Having thus described several embodiments for an improved substrate holder and techniques for controlling the temperature of a substrate during various processes of manufacturing a semiconductor device, the advantages of the invention can be appreciated. Variations from the described embodiment can be made by one skilled in the art without departing from the scope of the invention and the following claims.

What is claimed is:

1. A vortex type substrate holder comprising:
   a substrate holder body having a plurality of vortex chucks facing one side of the body where a substrate is to be retained by the vortex chucks;
   a frame rotatably mounted relative to the substrate holder body; said frame having a lip extending towards said one side of the body to seat said substrate as it is retained by the vortex chucks;
   whereby said substrate can be rotated by the frame while being held by said vortex chucks.

2. The vortex type substrate holder as claimed in claim 1 wherein said lip on the frame is located to contact an edge of the substrate.

3. The vortex type substrate holder as claimed in claim 2 and further including an actuator coupled to the frame for rotating the frame.

4. The vortex type substrate holder as claimed in claim 2 wherein said lip is a continuous edge so as to form a seal with said seated substrate to enable recapture of gas used in the vortex chucks.

5. The vortex type substrate holder as claimed in claim 3 wherein said actuator is further mounted to the substrate holder body to move in translation therewith.

6. The vortex type holder as claimed in claim 5 wherein said has a center of rotation and wherein said substrate has a center of mass, and wherein said center of rotation of the frame is offset from the center of mass within the plane of the substrate to inhibit a sliding of the substrate while being held by said vortex chucks.

7. he vortex type substrate holder as claimed in claim 3 wherein said holder body is non-rotationally mounted, and a particle filter located in line with gas fed to the vortex chucks to remove particles therefrom without passing through a rotating seal.

8. A vortex type substrate holder comprising:
   a substrate holder body having a plurality of vortex chucks facing one side of the body where a substrate is to be retained by the vortex chucks;
   said substrate holder body having a plurality of peripherally located position limiters within the plane of the substrate when it is retained by the vortex chucks so that the substrate position is laterally maintained; and
   an extension around the holder body and located outwardly from said position limiters to effectively extend the plane of the substrate by an amount sufficient to assure uniform treatment of the substrate near its outer edge by a hot gas stream.

9. The vortex type substrate holder as claimed in claim 8 wherein said extension has a width that is larger than half the width of a primary treatment area of the hot gas stream.

10. A vortex type substrate holder comprising:
    a substrate holder body having a plurality of vortex chucks facing one side of the body where a substrate is to be retained by the vortex chucks;
    said substrate holder body having a peripheral lip located around the vortex chucks, said lip being sized to sufficiently protrude so as to seat against an edge portion of the substrate when it is retained by the vortex chucks and form a seal therewith and define a gap between the substrate holder body and said substrate;
    said substrate holder body further having a return gas structure to recycle gas in the gap.

11. The vortex type substrate holder as claimed in claim 10 and further including a cooling fluid located to circulate within the body of the substrate holder to remove heat therefrom.

* * * * *